United States Patent
Li et al.

(10) Patent No.: US 9,774,197 B1
(45) Date of Patent: Sep. 26, 2017

(54) BATTERY INTERNAL SHORT-CIRCUIT DETECTION METHOD BASED ON CELL CHARGE BALANCING

(71) Applicant: Bordrin Motor Corporation, Southfield, MI (US)

(72) Inventors: Yonghua Li, Ann Arbor, MI (US); Zhiwei Zhang, Shanghai (CN)

(73) Assignee: BORDRIN MOTOR CORPORATION, INC., Southfield, MI (US)

( * ) Notice: Subject to any disclaimer, the term of this patent is extended or adjusted under 35 U.S.C. 154(b) by 0 days.

(21) Appl. No.: 15/439,370

(22) Filed: Feb. 22, 2017

(51) Int. Cl.
| | |
|---|---|
| H02J 7/00 | (2006.01) |
| H01M 2/34 | (2006.01) |
| H01M 10/48 | (2006.01) |
| H01M 2/10 | (2006.01) |
| B60L 11/18 | (2006.01) |
| G01R 31/02 | (2006.01) |
| G01R 31/36 | (2006.01) |
| G01R 31/00 | (2006.01) |
| H01M 10/42 | (2006.01) |

(52) U.S. Cl.
CPC ......... *H02J 7/0026* (2013.01); *B60L 11/1861* (2013.01); *B60L 11/1866* (2013.01); *G01R 31/007* (2013.01); *G01R 31/025* (2013.01); *G01R 31/3679* (2013.01); *H01M 2/1077* (2013.01); *H01M 2/34* (2013.01); *H01M 10/482* (2013.01); *H02J 7/0019* (2013.01); *H01M 2010/4271* (2013.01); *H01M 2220/20* (2013.01)

(58) Field of Classification Search
CPC .................................................. G01R 31/3662
USPC .......................................................... 320/118
See application file for complete search history.

(56) References Cited

U.S. PATENT DOCUMENTS

| | | | |
|---|---|---|---|
| 5,945,805 A * | 8/1999 | Takei | G01R 19/16542 320/124 |
| 8,405,352 B2 | 3/2013 | Lim | |
| 2013/0234672 A1 * | 9/2013 | Kubota | G01R 31/362 320/134 |
| 2014/0266229 A1 | 9/2014 | McCoy | |

FOREIGN PATENT DOCUMENTS

CN    201490741 U    5/2010

* cited by examiner

*Primary Examiner* — Edward Tso
*Assistant Examiner* — Ahmed Omar
(74) *Attorney, Agent, or Firm* — Brinks Gilson & Lione

(57) ABSTRACT

An internal short-circuit detection method for a battery cell of a battery pack is determined using a battery cell charge balancing resistor and switch. The switch is used for connecting or disconnecting the battery cell charge balancing resistor to the battery cell. Evolution of discharging of the battery with the battery cell-charge balancing resistor connected to the battery cell is monitored to measure an internal short-circuit resistance of the battery cell for estimating the state of the internal short-circuit.

11 Claims, 4 Drawing Sheets

BATTERY INTERNAL SHORT-CIRCUIT DETECTION METHOD BASED ON CELL CHARGE BALANCING

BACKGROUND

1. Field of the Invention

The present invention relates to the field of electric vehicle batteries, and in particular, to a battery internal short-circuit detection method based on battery cell balancing.

2. Description of Related Art

Due to problems in manufacturing processes and use pattern, a battery usually slowly develops an "internal short-circuit." A manifestation of an internal short-circuit is that although a battery is disconnected, there is still a local or global internal current loop within the battery cell. This loop causes internal circulation of current, thereby consuming battery energy and producing heat. In an extreme situation, a battery temperature may increase sharply, causing a potential hazard.

There are mainly two industrial methods for determining whether a battery has developed internal short-circuit. In one method, a magnitude of a leak current is deduced from change of a charge capacity of a battery after the battery is disconnected. This method, however, has the drawback of not being capable of effectively taking into account a resistance change inside a battery and its accuracy is easily impacted by change of an external temperature and a degree of a battery charge. The other method involves tracking for a sudden change of a battery terminal voltage when the battery is being charged. While this method can effectively identify a local short-circuit, it cannot track a slowly-developing internal short-circuit and is only applicable during charging of the battery.

In U.S. Patent Pub. No. 2014/0266229, an external voltage is applied to each battery cell of a battery pack to be tested for internal short-circuit. An internal short-circuit is determined by means of (externally additional) current measurement. However, this method requires separating a battery pack and applying a voltage to the battery cells from the outside, which is not convenient to operate and can easily result in damages to the battery.

SUMMARY

An objective of the present invention is to provide a battery internal short-circuit detection method based on battery cell charge balancing for solving the foregoing problem.

The objective of the present invention is implemented by the following technical solutions.

A battery internal short-circuit detection method based on battery cell charge balancing is used to detect an internal short-circuit state of a battery cell of a battery pack in an electric vehicle, where the method includes the following steps:

1) determining whether the battery satisfies an operation condition for battery cell charge balancing, if yes, performing step 2), and otherwise, returning to continuing determining whether the battery satisfies the operation condition;

2) performing a battery cell charge balancing operation on the battery cell and recording at least one battery cell charge balancing parameter of the battery;

3) calculating a battery cell charge balancing speed v of the battery according to the at least one battery cell charge balancing parameter of the battery recorded in step 2);

4) calculating an internal short-circuit state estimation value $\epsilon$ of the battery cell according to the battery cell charge balancing speed v of the battery; and 5) determining an internal short-circuit state of the battery cell according to the internal short-circuit state estimation value $\epsilon$ of the battery cell.

The operation condition for battery cell charge balancing may occur when a temperature of the battery cell is within a temperature threshold range, and the battery is in a fully-charged state or a charging starting state (close to empty state).

The at least one battery cell charge balancing parameter includes an initial charge state $SOC(i)_{start}$, a terminal charge state $SOC(i)_{end}$, and a battery cell charge balancing operation time $T_{cal2}$ of the battery cell.

Step 2) may specifically and exemplarily include:

21) separating the battery cell from a high voltage loop by disconnecting the battery back from a load of the battery pack for a specified time $T_{cal1}$;

22) reading a terminal voltage of the battery cell and obtaining an initial charge state $SOC(i)_{start}$ corresponding to the terminal voltage according to the terminal voltage of the battery cell;

23) connecting the battery cell to a battery cell charge balancing resistor by closing a battery cell charge balancing switch for a battery cell charge balancing operation time $T_{cal2}$;

24) disconnecting the battery cell charge balancing switch, and separating the battery cell from battery cell charge balancing resistor for the specified time $T_{cal1}$; and 25) reading or measuring a terminal voltage of the battery and obtaining a terminal charge state $SOC(i)_{end}$ corresponding to the terminal voltage of the battery cell.

The battery cell charge balancing speed v of the battery is specifically and exemplarily calculated based on:

$$v = \frac{(SOC(i)_{start} - SOC(i)_{end}) \times Q(i)}{T_{cal2}}$$

where $SOC(i)_{start}$ is an initial charge state, $SOC(i)_{end}$ is a terminal charge state, $T_{cal2}$ is the battery cell charge balancing time, and $Q(i)$ is a battery capacity.

The internal short-circuit state estimation value $\epsilon$ of the battery cell is specifically and exemplarily:

$$\varepsilon = \frac{v}{v_0}$$

where $v_0$ is a battery cell charge balancing speed when a battery life starts.

Step 5) may include the steps of:

51) determining whether the internal short-circuit state estimation value $\epsilon$ is greater than a first threshold value, e.g., 2, where if yes, it indicates that a battery short-circuit resistance is excessively low, and the battery is in a dangerous state, and otherwise, step 52) is performed;

52) determining whether the internal short-circuit state estimation value $\epsilon$ is greater than a second threshold value, e.g., 1.5 (but less than the first threshold value of, e.g., 2), where if yes, it indicates that the battery is in a limited function state, and otherwise, step 52) is performed; and 53) determining whether the internal short-circuit state estimation value $\epsilon$ is greater than a third threshold value, e.g., 1.2 (but less than the second threshold value of, e.g., 1.5), where if yes, it indicates that the battery is in a warning state, and otherwise, it indicates that the battery does not enter a warning line of a short-circuit state, and step 51) is returned.

When the battery is in a dangerous state, a Battery Management System (BMS) of the battery automatically disconnects the high-voltage loop and quickly discharges the battery by using a circuit.

The battery internal short-circuit detection method based on battery cell charge balancing further includes: drawing a graph for a battery life vs. battery cell charge balancing speed curve according to the calculated battery cell charge balancing speed v of the battery, to predict a battery internal short-circuit state.

Compared with the prior art, the present invention has the following beneficial effects. First, in this method, by performing a battery cell charge balancing operation on a battery cell, a trend of change in a battery internal short-circuit can be effectively tracked. In addition, the method can eliminate impact of a battery temperature and a battery charge capacity on the measured internal short-circuit speed by making measurement either at when the battery is in full charge state or near an empty charge state. As such, relatively accurate estimation is obtained.

Second, because a battery cell charge balancing resistor is disposed in a battery pack, and the battery pack or cell performs a battery cell charge balancing operation, in this method, an external voltage does not need to be applied to the battery cell, and an integral structure of the battery does not need to be dismantled. The method thus causes no damage to the battery while being convenient to perform.

Third, by performing the battery cell charge balancing operation of the battery cell when the battery cell is separated from the high voltage loop for a specified time can ensure that a battery temperature and an environment temperature are within a specified range, so that a charge state obtained according to a terminal voltage is reliable for inferring battery state of charge.

Fourth, when the battery is in a dangerous state, a BMS automatically disconnects the high-voltage loop and quickly discharges by using a circuit, ensuring a safe operation of the battery.

Fifth, a battery life vs. battery cell charge balancing speed curve graph is drawn to predict a battery internal short-circuit state. Consequently, an occurrence time of a battery internal short-circuit can be roughly estimated, so as to automatically arrange for performing a future battery cell charge balancing at an estimated time and performing detection on the battery internal short-circuit.

Further objects, features and advantages of this invention will become readily apparent to persons skilled in the art after a review of the following description, with reference to the drawings and claims that are appended to and form a part of this specification.

DETAILED DESCRIPTION

The present invention is described in detail with reference to the accompanying drawings and specific examples in the below. The examples are implemented based on the technical solutions of the present invention, and detailed implementation manners and specific operation processes are provided below. However, the protection scope of the present invention is not limited to the following examples.

Figure 2:
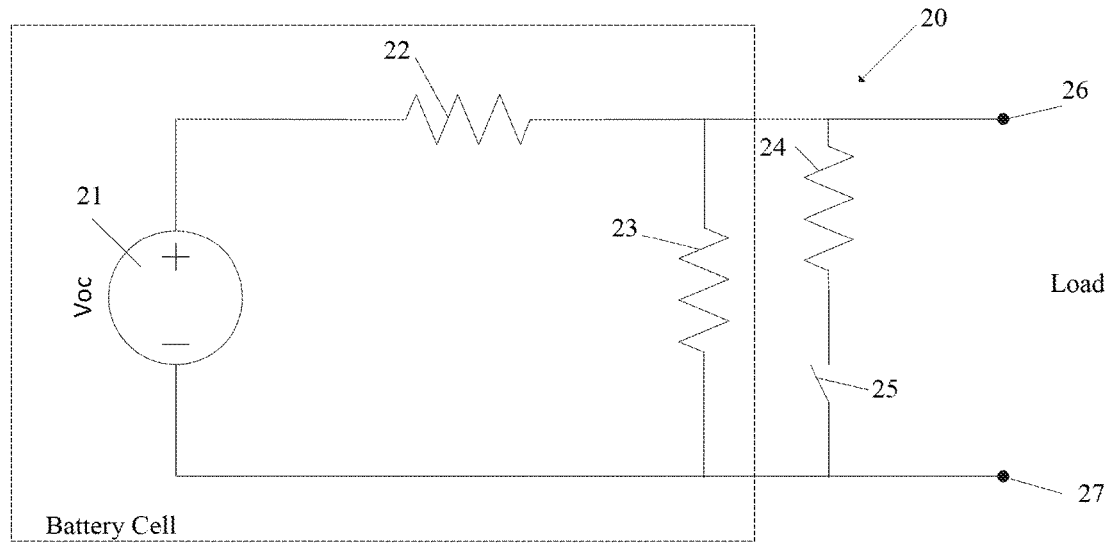
FIG. 2 is a schematic diagram of a circuit of battery cell charge balancing.

As shown in FIG. 2, illustrated is a schematic diagram of a circuit 20 for a battery cell charge balancing of a battery cell. Here, the circuit includes a model for a battery cell of the battery pack comprising a voltage source 21 connected in series with a resistor 22, and an internal short-circuit resistance 23 connected in parallel with the voltage source 21 and the resistor 22. The internal short-circuit resistance 23 represents an internal short-circuit equivalent resistance of the battery cell. Ideally and for a non-leaking battery cell, the internal short-circuit resistance 23 approaches infinity. However, as internal short-circuit develops in the battery cell, the internal short-circuit resistance 23 becomes smaller in value. The internal short-circuit resistance 23 thus represents the state of internal short-circuit for the battery cell. A series of a battery cell charge balancing resistor 24 and a battery cell charge balancing switch 25 are connected in parallel with voltage source 21 and the resistor 22. The circuit 20 may also include terminals 26 and 27 for connecting to other cells placed in series to form the battery pack. It should be understood that the terminal 26 of a battery cell at one end of the battery pack and terminal 27 of a battery cell at the other end of the battery pack may be connected to a load. The battery pack provides power to the load via those terminals of the battery cells at the two ends of the series of battery cells of the battery pack. The battery pack, when connected to the load, forms the high voltage loop. Terminals 26 and 27 of the battery cells may be accessible to external probes for monitoring and measurements.

Each battery cell of the battery pack may be modeled by circuit 20 of FIG. 2. Multiple battery cells may be packaged together, e.g., in series to form the battery pack. Battery cell charge balancing resistor 24 and switch 25 for each battery cell may be integrated with and packaged together with the battery back during the manufacturing process. Battery cell charge balancing resistor 24 may have a predetermined value for all the battery cells in the battery pack. Alternatively, each battery cell may be associated with a battery cell charge balancing resistor 24 of its own predetermined value. The integrated battery pack may provide control terminals for the battery cell charge balancing switch of each battery cell. For example, a voltage from BMS circuitry may be applied to one of these control terminals to open or close a corresponding battery cell charge balancing switch.

The battery cell charge balancing switch 25 may be closed to form a closed circuit for discharging the corresponding battery cell, even if the internal short-circuit resistance 23 may be very high (e.g., for a new and non-leaking battery cell). Such discharging of one of the battery cells may be utilized as a passive means to balance amounts of charges between battery cells. As will be described in more detail below, by adding the battery cell charge balancing resistor 24 of known value into the battery cell charge balancing circuit 20 and in series with the battery cell charge balancing switch, the internal short-circuit resistance 23 and thus the state of internal short-circuit of the battery cell may be conveniently monitored as it deteriorates (decreases in value) due to development of internal short-circuit.

Specifically and according to an exemplary operation of the battery cell charge balancing circuit 20, a battery cell charge balancing speed of a battery cell may be recorded during each battery cell charge balancing measurement.

When the battery is new and non-leaking, the internal short-circuit resistor 23 is high and the battery cell charge balancing speed of the battery cell is determined by the battery cell charge balancing resistor 24. However, once an internal short-circuit of the battery cell begins to develop, the internal short-circuit resistor 23 decrease in value to lower the parallel resistance of resistors 23 and 24, leading to an increase of battery cell charge balancing speed (higher discharging current) of the battery cell. As the internal short-circuit of the battery cell deteriorates, the battery cell charge balancing speed accelerates.

As such, the increase of degree of internal short-circuit (or decrease of the internal short-circuit resistor 23) and thus the deterioration of the internal short-circuit state of the battery cell is correlated with the battery cell charge balancing speed and can thus be estimated. A BMS can periodically track development of a battery internal short-circuit by monitoring the battery cell charge balancing speed against some predetermined thresholds, so as to take timely measures to prevent hazards from happening. In addition, a trend of the battery internal short-circuit development can be effectively tracked and predicted by using a time series of battery cell charge balancing speeds. Further, the battery cell charge balancing speed may be measured when a predetermined set of conditions are met (as detailed below), leading to relatively accurate estimation and prediction that are not impacted by a variation in battery temperature and a battery charge state.

Figure 1A:
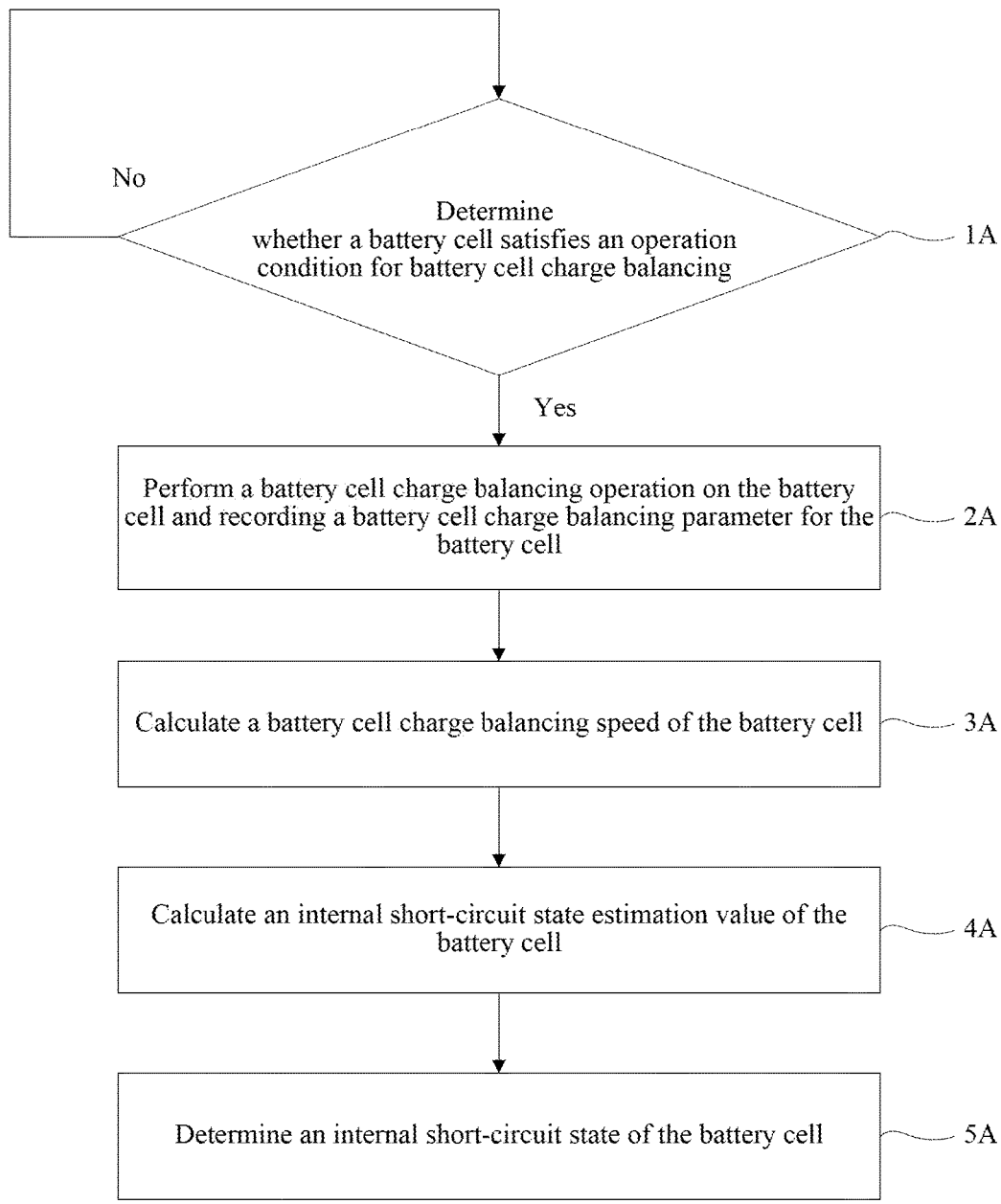
FIGS. 1A-1C illustrate flowcharts of methods according to the present invention.
Figure 1B:
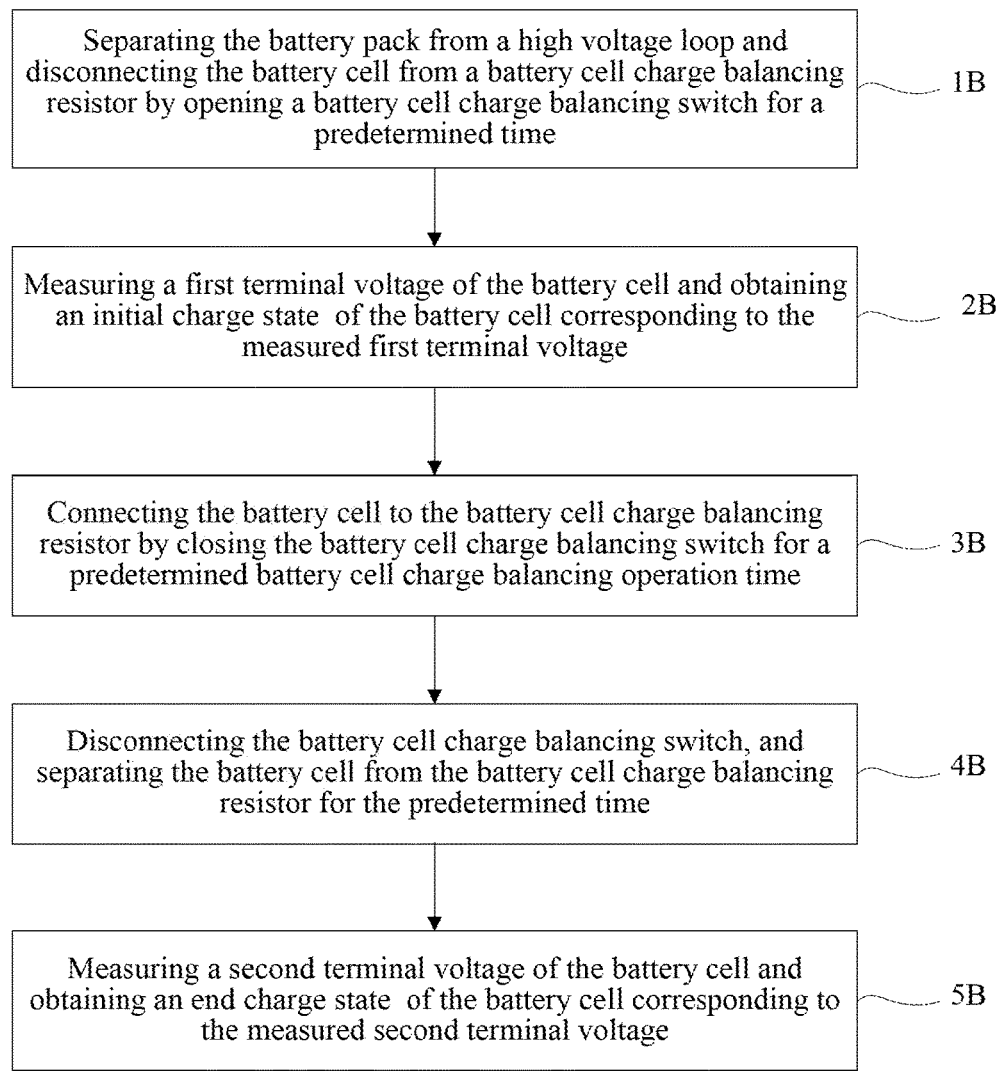
Figure 1C:
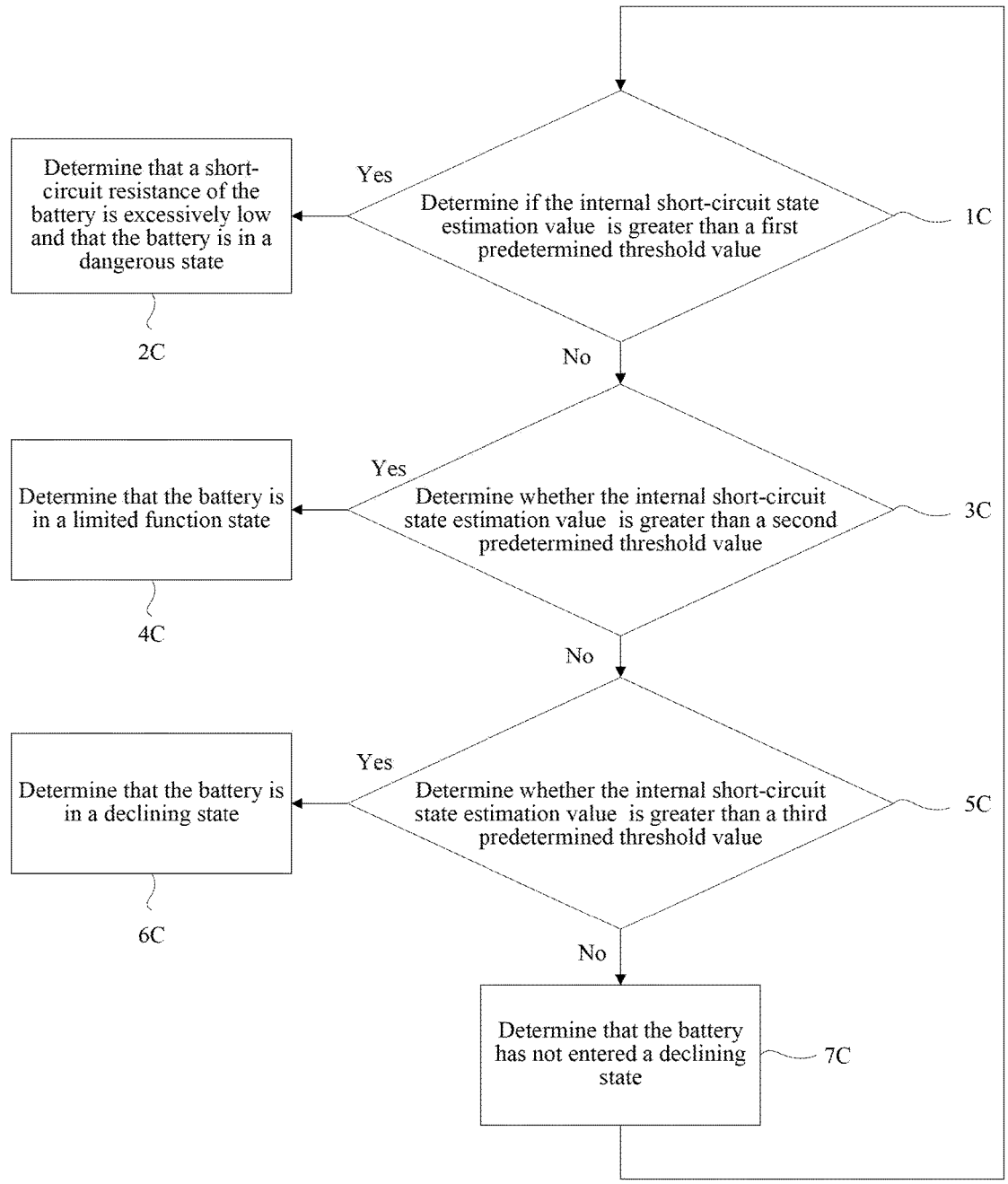

According to the foregoing principle, as shown in FIGS. 1A-1C and with reference to FIG. 2, a battery internal short-circuit detection method based on battery cell charge balancing is provided for detecting an internal short-circuit state of an ith battery cell of a battery pack in an electric vehicle and including the following steps:

1) Determine whether the ith battery cell satisfies an operation condition for battery cell charging balancing, if yes, perform step 2), and otherwise, return to continuing determining whether the operation condition is satisfied (Step 1A of FIG. 1A).

2) Perform a battery cell charge balancing operation on the ith battery cell and recording battery cell charge balancing parameters of the ith battery cell (Step 2A of FIG. 1A). This step may include the following sub-steps:

21) Separate the battery pack from the high voltage loop including all battery cells and the load and keep the battery cell charge balancing switch 25 for the ith battery cell open for a specified time $T_{cal1}$ (Step 1B of FIG. 1B);

22) Read or measure a terminal voltage of the ith battery cell and obtain an initial charge state $SOC(i)_{start}$ corresponding to the terminal voltage of the ith battery cell base on a SOC-OCV (Open Circuit Voltage) curve (Step 2B of FIG. 1B);

23) Connect the ith battery cell to the battery cell charge balancing resistor 24 by closing the battery cell charge balancing switch 25 for a battery cell charge balancing operation time $T_{cal2}$ (Step 3B of FIG. 1B);

24) Disconnect and open the battery cell balancing switch 25 for separating the ith battery cell from the battery cell charge balancing resistor 24 for the specified time $T_{cal1}$ (Step 4B of FIG. 1B); and 25) Read another terminal voltage of the battery ith cell and obtain an end charge state corresponding to the other terminal voltage of the ith battery cell based on the SOC-OCV curve (Step 5B of FIG. 1B).

3) Calculate a battery cell charge balancing speed v of the ith battery cell according to the battery cell charge balancing parameters of the battery recorded in step 2) (such as the terminal voltages of the battery and corresponding SOC) (Step 3A of FIG. 1A):

$$v = \frac{(SOC(i)_{start} - SOC(i)_{end}) \times Q(i)}{T_{cal2}}$$

where $SOC(i)_{start}$ is an initial charge state, $SOC(i)_{end}$ is a terminal (or end) charge state, $T_{cal2}$ is the battery cell charge balancing operation time, and $Q(i)$ is a battery capacity of the ith battery cell.

4) Calculate an internal short-circuit state estimation value ε of the ith battery cell according to the battery cell charge balancing speed v of the ith battery cell (Step 4A of FIG. 1A):

$$\varepsilon = \frac{v}{v_0}$$

where $v_0$ is a battery cell charge balancing speed at the beginning of the battery life.

5) Determine an internal short-circuit state of the ith battery cell according to the internal short-circuit state estimation value ε of the ith battery cell (Step 5A of FIG. 1A). Specifically:

51) Determine whether the internal short-circuit state estimation value ε is greater than a first predetermined threshold value, e.g., 2. A ε greater than the first predetermined threshold value indicates that a short-circuit resistance of the battery is excessively low (Step 1C of FIG. 1C), and the battery is in a dangerous state (Step 2C of FIG. 1C). Otherwise, step 52) is performed.

52) Determine whether the internal short-circuit state estimation value ε is greater than a second predetermined threshold value, e.g., 1.5, but smaller than the first predetermined threshold value, e.g., 2.0 (Step 3C of FIG. 1C). A ε greater than the second predetermined threshold value but smaller than the first predetermined threshold value (e.g., 2) but smaller than the first predetermined threshold value, e.g., 2.0 indicates that the battery is in a limited function state (Step 4C of FIG. 1C). Otherwise, step 53) is performed.

53) Determine whether the internal short-circuit state estimation value ε is greater than a third predetermined threshold value, e.g., 1.2, but smaller than the second predetermined threshold value, e.g., 1.5 (Step 5C of FIG. 1C). A ε greater than the second predetermined threshold value, but smaller than the second predetermined threshold value (e.g., 1.5), indicates that the battery is in an operational but non-ideal state (Step 6C of FIG. 1C). A ε smaller than the third predetermined threshold value indicates that the battery has not developed sufficient internal short-circuit and has not entered a state with alarming internal short-circuit and the process returns to step 51) (Step 7C of FIG. 1C).

53) Determine whether the internal short-circuit state estimation value ε is greater than a third predetermined threshold value, e.g., 1.2, but smaller than the second predetermined threshold value, e.g., 1.5. A ε greater than the second predetermined threshold value, but smaller than the second predetermined threshold value (e.g., 1.5), indicates that the battery is in an operational but non-ideal state. A ε smaller than the third predetermined threshold value indicates that the battery has not developed sufficient internal short-circuit and has not entered a state with alarming internal short-circuit and the process returns to step 51).

The process above for estimating the internal short-circuit state of the ith battery cell of the battery pack may be similarly used to estimate the internal short-circuit state of other battery cells of the battery pack.

Multiple battery cell charge balancing operations may be performed and the internal short-circuit state estimation value ϵ may be obtained each time. The term terminal voltage may be alternatively referred to as open circuit voltage. Further, the specified or predetermined time $T_{cal1}$ may be intended as a rest time before a terminal voltage of the battery is measured. A rest time $T_{cal1}$ before the measurement helps ensure that the battery is in a stable state when measured and thus the measured terminal voltage is less affected by inaccuracy caused by transient dynamics in the battery. The rest time $T_{cal1}$ may, for example, be between 3 minutes and 5 days. In some implementation, the rest time $T_{cal1}$ may be specified as small as possible. For example, rest time $T_{cal1}$ may be specified as a minimum length of time that the battery need to stabilize and reach thermal and electrical equilibria, after, e.g., the battery pack is disconnected from the high voltage loop. Shortening the rest time helps reduces the effect of discharging of the battery during the rest time (via the internal short-circuit resistor 23) on the accuracy of the measured battery cell charge balancing speed v.

In step 23) above during the battery cell charge balancing operation, the battery cell is disconnected from the high voltage loop by disconnecting the load from the battery pack. Alternatively, the battery cell may be connected to the high voltage loop during the battery cell charge balancing operation.

According to the foregoing steps, specific battery internal short-circuit detection is performed. An exemplary process is as follows:

Before a battery cell charge balancing operation is performed, a battery cell is monitored for a satisfaction of the following conditions: the battery temperature is within a certain predetermined range (for example, 15° C. to 25° C.); and the battery cells are approximately fully charged, or approximately at a minimum SOC (close to empty). An internal short-circuit of the battery detected based on battery cell charge balancing under these conditions may ensure that the estimated battery internal short-circuit state is not impacted by a battery temperature and level of SOC when measurements are made. For example, the SOC-OCV curve may be a nonlinear function of the level of charge. In other words, for the same difference of SOC (for example, 1%), the corresponding OCV difference may be significantly different for the battery cell. Thus, rather than having to accurately determine the charge level in the process of deducing SOC from OCV, it may be convenient to make the measurements above when the battery cell is close to full charge to close to empty. If the above conditions (relating to temperature and charge level of the battery cell) do not satisfy for a long period of time and, as a consequence, an estimation of an internal short-circuit state for a particular battery cell cannot be obtained during that time period by means of the battery cell charge balancing method above, the conditions above may be temporarily relaxed for purposes of proactive detection of the state of short-circuit using the battery cell charge balancing circuit.

In one example, a battery cell charge balancing may be performed. Specifically:

Step 1: Key off a vehicle. The battery cells of the battery pack are separated from the load and the battery cell charge balancing resistors 24 by opening the battery cell charge balancing switches 25 for at least $T_{cal1}$. In this way, a battery temperature and an environment temperature can be ensured to be within a desired range, so that a SOC value can be reliably determined by measuring the terminal voltage of each battery cell and using an SOC-OCV curve.

Step 2: Read a terminal voltage of each battery cell of the battery pack and determine $SOC(i)_{start}$ of each battery cell.

Step 3: Close the battery cell charge balancing switches 25 to perform battery cell balancing.

Step 4: Maintain a battery cell balancing switches closing time of at least $T_{cal2}$.

Step 5: Open the cell balancing switches 25 and keep the battery pack separate from the high voltage loop for at least $T_{cal1}$.

Step 6: Read a terminal voltage of the ith battery cell and calculate corresponding $SOC(i)_{end}$.

Step 7: Calculate a battery cell balancing speed of the ith battery cell $$v = \frac{(SOC(i)_{start} - SOC(i)_{end}) \times Q(i)}{T_{cal2}}.$$

Step 8: Store the calculated battery cell balancing speed corresponding to the ith battery cell and a corresponding test calendar time (time relative to the battery life) to a Flash Memory.

The measurement and calculations above may be performed at a series of times for a particular battery cell of the battery pack. The corresponding pairs of battery cell charge balancing speed and time may be stored in the Flash Memory. Based on these calculated and timed battery cell charge balancing speeds, an internal short-circuit trend for the battery cells of the battery pack may be estimated. For a particular battery cell of the battery pack, all battery cell charge balancing speeds and corresponding test times are read from the Flash memory and analyzed to determine the state of internal short-circuit for the battery cell and to determine whether to take system measures (such as issuing system warnings) according to predetermined thresholds:

A: If a current battery cell charge balancing speed reaches a threshold of 120% of an initial (BOL) battery cell balancing speed, the internal short-circuit resistance 23 is roughly equal to five times of the battery cell charge balancing resistance of R24, and an alarm may be issued by a BMS.

B: If a current battery cell charge balancing speed reaches a threshold of 150% of an initial (BOL) battery cell charge balancing speed, the internal short-circuit resistance R23 is roughly equal to twice of the battery cell charge balancing resistance R24, and the BMS may set the system to be in "a limited function state".

C: If a current battery cell charge balancing speed reaches a threshold of 200% of an initial (BOL) battery cell charge balancing speed, the internal short-circuit resistance R23 is roughly equal to the cell charge balancing resistance R24, and the BMS may set the system to be in a "dangerous" state, report the condition to a vehicle controller and a charge controller, disconnect the load from the battery pack, and discharges (e.g., rapidly discharges) all stored electricity by using a discharging circuit.

It should be noted that the threshold values above are merely examples and are determined according to vehicle system requirements and specific battery cell charge balancing resistance values. If cell charge balancing measurements and battery cell charge balancing speed data on some particular battery cells could not be obtained for period of time (because, for example, the temperature and SOC conditions discussed above are not met for that period of time), the BMS can force these battery cell charge balancing measurements on these battery cells by relaxing the temperature and charge state conditions above. For example, the temperature range may be expanded by 5 degrees ° C. on either the higher end, lower end, or both ends of the pre-specified temperature range. For another example, the condition that the battery cell is fully charged (100% charged) may be relaxed to 94% charged. In such a manner, some measurement for the battery cell charge balancing speed is made during any time longer than the period of time. This may be a special operation/monitoring mode for modifying the temperature or charge state conditions. Whether to perform measurements in this mode may be based on, for example, a length of time since last battery cell charge balancing speed is calculated. This length of time may be predetermined, may be calibrated. It may be, for example, 1 week. For example, this mode may be turned on after it is detected that no measurement of the battery cell charge balancing speed has been made after the predetermined period of time has elapsed.

As an example, a series of battery cell charge balancing control data of a particular battery cell is as follows. The first line is battery life data in units of, for a day. The second line is corresponding calculated relative battery cell charge balancing speeds relative to an initial battery cell balancing speed.

| 1 | 3 | 7 | 15 | 24 | 68 | 112 | 156 | 209 | 378 | 565 | 768 | 1002 | 1232 |
|---|---|---|---|---|---|---|---|---|---|---|---|---|---|
| 1 | 1.05 | 1.13 | 1.12 | 1.18 | 1.19 | 1.22 | 1.25 | 1.28 | 1.27 | 1.32 | 1.35 | 1.54 | 1.52 |

Figure 3:
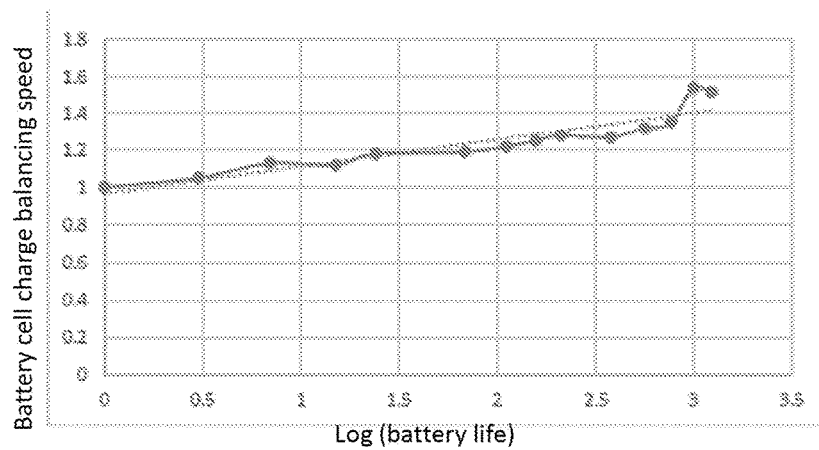
FIG. 3 is a battery life-cell charge balancing speed curve graph obtained in an example.

A battery life-cell balancing speed curve may be drawn according to the foregoing data. As shown in FIG. 3, it can be seen from the graph, based on the exemplary threshold values above, that the BMS gives an alarm at about the 112th days (according to a threshold for relative battery cell charge balancing speed of 1.2); the system enters a limited function state at the 1002th day (according to a threshold for relative battery cell charge balancing speed of 1.5). In this exemplary data, no trigger for a dangerous state within 1232 days would be given (according to a threshold for relative battery cell charge balancing speed of 2.0). In FIG. 3, a dotted line indicates a trend of the relative battery cell charge balancing speed. If necessary, the BMS may warn a vehicle control and diagnosis modules for a projected future time when the battery system may enter a dangerous state, by, for example, extrapolate the trend line.

In an alternative embodiment, dedicated hardware implementations, such as application specific integrated circuits, programmable logic arrays and other hardware devices, can be constructed to implement one or more of the methods described herein. Applications that may include the apparatus and systems of various embodiments can broadly include a variety of electronic and computer systems. One or more embodiments described herein may implement functions using two or more specific interconnected hardware modules or devices with related control and data signals that can be communicated between and through the modules, or as portions of an application-specific integrated circuit. Accordingly, the present system encompasses software, firmware, and hardware implementations.

In accordance with various embodiments of the present disclosure, the methods described herein may be implemented by software programs executable by a computer system. Further, in an exemplary, non-limited embodiment, implementations can include distributed processing, component/object distributed processing, and parallel processing. Alternatively, virtual computer system processing can be constructed to implement one or more of the methods or functionality as described herein.

Further the methods described herein may be embodied in a computer-readable medium. The term "computer-readable medium" includes a single medium or multiple media, such as a centralized or distributed database, and/or associated caches and servers that store one or more sets of instructions. The term "computer-readable medium" shall also include any medium that is capable of storing, encoding or carrying a set of instructions for execution by a processor or that cause a computer system to perform any one or more of the methods or operations disclosed herein.

As a person skilled in the art will readily appreciate, the above description is meant as an illustration of the principles of this invention. This description is not intended to limit the scope or application of this invention in that the invention is susceptible to modification, variation and change, without departing from spirit of this invention, as defined in the following claims.

The invention claimed is:

1. A battery internal short-circuit detection method based on battery cell charge balancing for detecting an internal short-circuit state of a battery cell of a battery pack in an electric vehicle, the method comprising:

1) monitoring a set of operation parameters of the battery cell until the monitored operation parameters satisfy a predetermined operation condition for battery cell charge balancing;
2) performing a battery cell charge balancing operation on the battery cell and recording at least one battery cell charge balancing parameter of the battery;
3) calculating a battery cell charge balancing speed v of the battery according to the at least one battery cell charge balancing parameter of the battery cell recorded in step 2);
4) calculating an estimated internal short-circuit state value $\epsilon$ of the battery cell according to the battery cell charge balancing speed v of the battery cell;
5) determining an internal short-circuit state of the battery cell according to the estimated internal short-circuit state value $\epsilon$ of the battery cell;

wherein the predetermined operation condition for battery cell charge balancing comprises a predetermined operation temperature range, and a battery charge state being a fully-charged state; and wherein the predetermined operation temperature range, or the predetermined battery charge state is relaxed when the monitoring step has continued for more than a predetermined time period.

2. A battery internal short-circuit detection method based on battery cell charge balancing for detecting an internal short-circuit state of a battery cell of a battery pack in an electric vehicle, the method comprising:

1) monitoring a set of operation parameters of the battery cell until the monitored operation parameters satisfy a predetermined operation condition for battery cell charge balancing;
2) performing a battery cell charge balancing operation on the battery cell and recording at least one battery cell charge balancing parameter of the battery;

3) calculating a battery cell charge balancing speed v of the battery according to the at least one battery cell charge balancing parameter of the battery cell recorded in step 2);
4) calculating an estimated internal short-circuit state value ϵ of the battery cell according to the battery cell charge balancing speed v of the battery cell;
5) determining an internal short-circuit state of the battery cell according to the estimated internal short-circuit state value ϵ of the battery cell;

wherein the predetermined operation condition for battery cell charge balancing comprises a predetermined operation temperature range, and a battery charge state being a fully-charged state; and wherein step 2) comprises:
21) separating the battery pack from a high voltage loop and disconnecting the battery cell from a battery cell charge balancing resistor by opening a battery cell charge balancing switch for a predetermined time $T_{cal1}$;
22) measuring a first terminal voltage of the battery cell and obtaining an initial charge state $SOC(i)_{start}$ of the battery cell corresponding to the measured first terminal voltage;
23) connecting the battery cell to the battery cell charge balancing resistor by closing the battery cell charge balancing switch for a predetermined battery cell charge balancing operation time $T_{cal2}$;
24) disconnecting the battery cell charge balancing switch, and separating the battery cell from the battery cell charge balancing resistor for the predetermined time $T_{cal1}$; and
25) measuring a second terminal voltage of the battery cell and obtaining an end charge state $SOC(i)_{end}$ of the battery cell corresponding to the measured second terminal voltage.

3. The battery internal short-circuit detection method based on battery cell charge balancing according to claim 1, wherein the predetermined operation condition for battery cell charge balancing comprises a predetermined operation temperature range, and a battery charge state being an empty state.

4. A battery internal short-circuit detection method based on battery cell charge balancing for detecting an internal short-circuit state of a battery cell of a battery pack in an electric vehicle, the method comprising:
1) monitoring a set of operation parameters of the battery cell until the monitored operation parameters satisfy a predetermined operation condition for battery cell charge balancing;
2) performing a battery cell charge balancing operation on the battery cell and recording at least one battery cell charge balancing parameter of the battery;
3) calculating a battery cell charge balancing speed v of the battery according to the at least one battery cell charge balancing parameter of the battery cell recorded in step 2);
4) calculating an estimated internal short-circuit state value ϵ of the battery cell according to the battery cell charge balancing speed v of the battery cell;
5) determining an internal short-circuit state of the battery cell according to the estimated internal short-circuit state value ϵ of the battery cell;

wherein the predetermined operation condition for battery cell charge balancing comprises a predetermined operation temperature range, and a battery charge state being an empty state; and wherein the predetermined operation temperature range, or the predetermined battery charge state is relaxed when the monitoring step has continued for more than a predetermined time period.

5. A battery internal short-circuit detection method based on battery cell charge balancing for detecting an internal short-circuit state of a battery cell of a battery pack in an electric vehicle, the method comprising:
1) monitoring a set of operation parameters of the battery cell until the monitored operation parameters satisfy a predetermined operation condition for battery cell charge balancing;
2) performing a battery cell charge balancing operation on the battery cell and recording at least one battery cell charge balancing parameter of the battery;
3) calculating a battery cell charge balancing speed v of the battery according to the at least one battery cell charge balancing parameter of the battery cell recorded in step 2);
4) calculating an estimated internal short-circuit state value ϵ of the battery cell according to the battery cell charge balancing speed v of the battery cell;
5) determining an internal short-circuit state of the battery cell according to the estimated internal short-circuit state value ϵ of the battery cell;

wherein the predetermined operation condition for battery cell charge balancing comprises a predetermined operation temperature range, and a battery charge state being an empty state; and wherein step 2) comprises:
21) separating the battery pack from a high voltage loop and disconnecting the battery cell from a battery cell charge balancing resistor by opening a battery cell charge balancing switch for a predetermined time $T_{cal1}$;
22) measuring a first terminal voltage of the battery cell and obtaining an initial charge state $SOC(i)_{start}$ of the battery cell corresponding to the measured first terminal voltage;
23) connecting the battery cell to the battery cell charge balancing resistor by closing the battery cell charge balancing switch for a predetermined battery cell charge balancing operation time $T_{cal2}$;
24) disconnecting the battery cell charge balancing switch, and separating the battery cell from the battery cell charge balancing resistor for the predetermined time $T_{cal1}$; and
25) measuring a second terminal voltage of the battery cell and obtaining an end charge state $SOC(i)_{end}$ of the battery cell corresponding to the measured second terminal voltage.

6. A battery internal short-circuit detection method based on battery cell charge balancing for detecting an internal short-circuit state of a battery cell of a battery pack in an electric vehicle, the method comprising:
1) monitoring a set of operation parameters of the battery cell until the monitored operation parameters satisfy a predetermined operation condition for battery cell charge balancing;
2) performing a battery cell charge balancing operation on the battery cell and recording at least one battery cell charge balancing parameter of the battery;
3) calculating a battery cell charge balancing speed v of the battery according to the at least one battery cell charge balancing parameter of the battery cell recorded in step 2);

4) calculating an estimated internal short-circuit state value ϵ of the battery cell according to the battery cell charge balancing speed v of the battery cell;

5) determining an internal short-circuit state of the battery cell according to the estimated internal short-circuit state value ϵ of the battery cell; and wherein the at least one battery cell charge balancing parameter comprises an initial charge state $SOC(i)_{start}$, a terminal charge state $SOC(i)_{end}$, and a battery cell charge balancing operation time $T_{cal2}$ of the battery.

7. A battery internal short-circuit detection method based on battery cell charge balancing for detecting an internal short-circuit state of a battery cell of a battery pack in an electric vehicle, the method comprising:

1) monitoring a set of operation parameters of the battery cell until the monitored operation parameters satisfy a predetermined operation condition for battery cell charge balancing;

2) performing a battery cell charge balancing operation on the battery cell and recording at least one battery cell charge balancing parameter of the battery;

3) calculating a battery cell charge balancing speed v of the battery according to the at least one battery cell charge balancing parameter of the battery cell recorded in step 2);

4) calculating an estimated internal short-circuit state value ϵ of the battery cell according to the battery cell charge balancing speed v of the battery cell;

5) determining an internal short-circuit state of the battery cell according to the estimated internal short-circuit state value ϵ of the battery cell; and wherein the cell balancing speed v of the battery cell is calculated according to:

$$v = \frac{(SOC(i)_{start} - SOC(i)_{end}) \times Q(i)}{T_{cal2}}$$

wherein $SOC(i)_{start}$ is an initial charge state, $SOC(i)_{end}$ is a terminal charge state, $T_{cal2}$ is a cell balancing operation time, and $Q(i)$ is a capacity of the battery cell.

8. A battery internal short-circuit detection method based on battery cell charge balancing for detecting an internal short-circuit state of a battery cell of a battery pack in an electric vehicle, the method comprising:

1) monitoring a set of operation parameters of the battery cell until the monitored operation parameters satisfy a predetermined operation condition for battery cell charge balancing;

2) performing a battery cell charge balancing operation on the battery cell and recording at least one battery cell charge balancing parameter of the battery;

3) calculating a battery cell charge balancing speed v of the battery according to the at least one battery cell charge balancing parameter of the battery cell recorded in step 2);

4) calculating an estimated internal short-circuit state value ϵ of the battery cell according to the battery cell charge balancing speed v of the battery cell;

5) determining an internal short-circuit state of the battery cell according to the estimated internal short-circuit state value ϵ of the battery cell; and wherein the internal short-circuit state estimation value ϵ of the battery is calculated according to:

$$\varepsilon = \frac{v}{v_0}$$

wherein $v_0$ is a battery cell charge balancing speed when a battery life starts.

9. A battery internal short-circuit detection method based on battery cell charge balancing for detecting an internal short-circuit state of a battery cell of a battery pack in an electric vehicle, the method comprising:

1) monitoring a set of operation parameters of the battery cell until the monitored operation parameters satisfy a predetermined operation condition for battery cell charge balancing;

2) performing a battery cell charge balancing operation on the battery cell and recording at least one battery cell charge balancing parameter of the battery;

3) calculating a battery cell charge balancing speed v of the battery according to the at least one battery cell charge balancing parameter of the battery cell recorded in step 2);

4) calculating an estimated internal short-circuit state value ϵ of the battery cell according to the battery cell charge balancing speed v of the battery cell;

5) determining an internal short-circuit state of the battery cell according to the estimated internal short-circuit state value ϵ of the battery cell; and wherein step 5) comprises:

51) determining whether the internal short-circuit state estimation value ϵ is greater than a first predetermined threshold value and upon determining that ϵ is greater than the first predetermined threshold value, determining that a short-circuit resistance of the battery is excessively low and that the battery is in a dangerous state, and otherwise, step 52) is performed;

52) determining whether the internal short-circuit state estimation value ϵ is greater than a second predetermined threshold value and upon determining that ϵ is greater than the second predetermined threshold value, determining that the battery is in a limited function state, and otherwise, step 53) is performed; and 53) determining whether the internal short-circuit state estimation value ϵ is greater than a third predetermined threshold value and upon determining that ϵ is greater than the second predetermined threshold value, determining that the battery is in a declining state, and otherwise, determining that the battery has not entered a declining state.

10. The battery internal short-circuit detection method based on battery cell charge balancing according to claim 9, wherein when the battery is in a dangerous state, a battery management system of the battery automatically disconnects a high voltage loop from the battery and quickly discharges by using a circuit.

11. A battery internal short-circuit detection method based on battery cell charge balancing for detecting an internal short-circuit state of a battery cell of a battery pack in an electric vehicle, the method comprising:

1) monitoring a set of operation parameters of the battery cell until the monitored operation parameters satisfy a predetermined operation condition for battery cell charge balancing;

2) performing a battery cell charge balancing operation on the battery cell and recording at least one battery cell charge balancing parameter of the battery;
3) calculating a battery cell charge balancing speed v of the battery according to the at least one battery cell charge balancing parameter of the battery cell recorded in step 2);
4) calculating an estimated internal short-circuit state value $\epsilon$ of the battery cell according to the battery cell charge balancing speed v of the battery cell;
5) determining an internal short-circuit state of the battery cell according to the estimated internal short-circuit state value $\epsilon$ of the battery cell;
(6) constructing a battery life-cell balancing speed curve graph according to the calculated cell balancing speed v of the battery cell at different times; and
(7) predicting a battery internal short-circuit state for a future time for the battery cell.

\* \* \* \* \*